(12) United States Patent
Sassine et al.

(10) Patent No.: US 10,803,940 B2
(45) Date of Patent: Oct. 13, 2020

(54) METHOD FOR PROGRAMMING A RESISTIVE RANDOM ACCESS MEMORY

(71) Applicant: COMMISSARIAT A L'ENERGIE ATOMIQUE ET AUX ENERGIES ALTERNATIVES, Paris (FR)

(72) Inventors: Gilbert Sassine, Grenoble (FR); Gabriel Molas, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/408,786

(22) Filed: May 10, 2019

(65) Prior Publication Data

US 2020/0005867 A1 Jan. 2, 2020

(30) Foreign Application Priority Data

May 11, 2018 (FR) .................................... 18 53997

(51) Int. Cl.
*G11C 11/00* (2006.01)
*G11C 13/00* (2006.01)

(52) U.S. Cl.
CPC ...... *G11C 13/0069* (2013.01); *G11C 13/0007* (2013.01); *G11C 13/0097* (2013.01); *G11C 2013/0078* (2013.01)

(58) Field of Classification Search
CPC ............ G11C 13/0069; G11C 13/0007; G11C 13/0097; G11C 2013/0078

USPC ......................................................... 365/148
See application file for complete search history.

(56) References Cited

U.S. PATENT DOCUMENTS

2015/0364193 A1* 12/2015 Shimakawa ....... G11C 13/0069
365/160

OTHER PUBLICATIONS

Search Report as issued in French Patent Application No. 1853997, dated Jan. 30, 2019.
Kerber, A., et al., "Reliability screening of high-k dielectrics based on voltage ramp stress," Microelectronics Reliability 47 (2007), pp. 513-517.
Luo, W.-C., et al., "Rapid Prediction of RRAM Reset-State Disturb by Ramped Voltage Stress," IEEE Electron Device Letters, vol. 33, No. 4, Apr. 2012, pp. 597-599.

(Continued)

*Primary Examiner* — Huan Hoang
(74) *Attorney, Agent, or Firm* — Pillsbury Winthrop Shaw Pittman LLP

(57) ABSTRACT

A method for programming a resistive random access memory including a matrix of memory cells. This method includes a programming procedure that includes applying a programming voltage ramp to the memory cells of a part at least of the matrix, the programming voltage ramp starting at a first non-zero voltage value, called start voltage, and ending at a second voltage value, called stop voltage, greater in absolute value than the first voltage value. The stop voltage is determined such that each memory cell of said at least one part of the matrix has a first probability between $1/(10N)$ and $1/N$ of having a programming voltage greater in absolute value than the stop voltage ($V_{stop}$), N being the number of memory cells in the at least one part of the matrix.

11 Claims, 4 Drawing Sheets

(56) References Cited

OTHER PUBLICATIONS

Yin, M., et al. "Improvement of Resistive Switching in $Cu_xO$ Using New Reset Mode," IEEE Electron Device Letters, vol. 29, No. 7, Jul. 2008, XP011229619, pp. 681-683.

Sassine, G., et al., "Sub-pJ Consumption and Short Latency Time in RRAM Arrays for High Endurance Applications," 2018 IEEE International Reliability Physics Symposium (IRPS), Mar. 2018, XP033337490, 5 pages.

\* cited by examiner

METHOD FOR PROGRAMMING A RESISTIVE RANDOM ACCESS MEMORY

CROSS-REFERENCE TO RELATED APPLICATIONS

This application claims priority to French patent application number 1853997, filed May 11, 2018. The content of this application is incorporated herein by reference in its entirety.

TECHNICAL FIELD

The present invention is relative to the field of variable resistance non-volatile memories, also called resistive random access memories or RRAMs. More specifically, the invention relates to a method for programming a resistive random access memory.

PRIOR ART

Resistive random access memories (RRAMs) are today the subject of great interest, notably on account of their low electrical consumption, their high density and their great endurance. Several resistive random access memory technologies are in the course of development with various degrees of maturity. PCRAMs (Phase-Change Random Access Memories), CBRAMs (Conductive-Bridging Random Access Memories) and OxRAMs (Oxide-based Random Access Memories) may notably be cited.

A resistive memory comprises a multitude of memory cells arranged in lines and columns, in the form of a matrix. Depending on its size, the matrix of memory cells may be divided into blocks, each block comprising for example 4096 memory cells.

Each memory cell comprises a layer of dielectric material arranged between two electrodes. The dielectric material is capable of switching reversibly between a high resistance state and a low resistance, respectively called "HRS" and "LRS". These two resistance states make it possible to store an information bit in each memory cell.

The mechanism behind the variation in resistance of the memory cell depends on the technology used. In PCRAMs for example, it involves chalcogenide semiconductor materials that can be made to transit from an amorphous state (high resistance) to a crystalline state (low resistance), or vice versa, by voltage pulses of appropriate amplitude and duration. In CBRAMs, conductive filaments are formed or destroyed by making metal ions (for example $Ag^+$) diffuse in a semiconductor matrix (for example Ge). Finally, OxRAMs have a behavior similar to that of CBRAMs in the sense that a conductive path forms between the electrodes. This conductive path seems to be due to the accumulation of oxygen vacancies within the oxide layer (at least for the family of transition metal based oxides), rather than the accumulation of metal ions. All of these memory forms involve the passage of an electrical current through the memory cell, which has an electrical resistance varying between a first high value and a second lower value.

Programming a resistive memory cell consists in making it pass from the high resistance state (HRS) to the low resistance state (LRS), or vice versa. The programming operation making it possible to pass from the state HRS to the state LRS is called writing or "set", whereas the programming operation making it possible to pass from the state LRS to the state HRS is called erasing or "reset". The memory cell is programmed by applying between its electrodes a programming voltage (positive or negative depending on whether it involves a writing or an erasing).

The memory cells of the matrix are generally programmed (i.e. written or erased) in a collective manner, for example by blocks. All the memory cells of the matrix may also be programmed simultaneously.

Two main schemes for programming a resistive memory cell exist: the so-called "CVS" (Constant Voltage Stress) method and the so-called "RVS" (Ramp Voltage Stress) method. The CVS and RVS methods, represented respectively by FIGS. 1A and 1B, are behind the characterization techniques used to study the reliability of oxides in MOS (Metal-Oxide-Semiconductor) structures. They respectively make it possible to measure the breakdown time and voltage of the oxide. These two methods have been described and compared in the articles ["Rapid Prediction of RRAM RESET-State Disturb by Ramped Voltage Stress", W. C. Luo et al., IEEE Electron Device Letters, Vol. 33, No. 4, pp. 597-599, 2012] and ["Reliability screening of high-k dielectrics based on voltage ramp stress", A. Kerber et al., Microelectronics Reliability, Vol. 47, No. 4-5, pp. 513-517, 2007].

The CVS method (cf. FIG. 1A) consists in applying to the memory cell a pulse 10 of constant voltage $V_{prog}$ until a predetermined current level is obtained. The electrical current flowing through the memory cell is measured at regular intervals during the voltage pulse 10. Once the current level has been reached, the voltage pulse 10 is stopped.

This method makes it possible to plot the evolution of the electrical current as a function of the duration of the pulse 10 and to extract the programming time $t_{prog}$ of the memory cell. For example, the writing of a memory cell results in an abrupt increase in the electrical current, because the memory cell passes from the high resistance state to the low resistance state. The programming time $t_{prog}$ of the memory cell (in the low resistance state) is the duration at which the abrupt increase in current takes place.

The main drawback of the CVS method is the great dispersion of the programming times $t_{prog}$ of memory cells within a same matrix. FIG. 2 shows the cumulative distribution of the programming times $t_{prog}$ of 100 OxRAM memory cells ($Ni/HfO_2/p^+$-Si) programmed in the state LRS by the CVS method. The programming voltage $V_{prog}$ applied to these memory cells is 1 V.

It may be noted thanks to this figure that the programming time $t_{prog}$ varies, for 100 memory cells belonging to a same matrix, from around 1 µs to 1 ms. It is thus necessary to apply a voltage pulse of a duration at least equal to 1 ms if it is wished to program all these cells in one go. The CVS method is thus particularly slow for programming all or part of a matrix of memory cells. With this method, the memory cells further undergo an electrical stress throughout the duration of the pulse, whatever their actual programming duration, which adversely affects the reliability of the resistive random access memory.

The RVS method (FIG. 1B) consists in applying to the memory cell to program a voltage ramp 20, in staircase form. This ramp 20 comprises successive voltage stages 21, that is to say periods where the applied voltage is constant, in order to be able to measure the current that passes through the memory cell. The voltage ramp 20 ends when a predetermined current level is reached. The first stage 21 is situated at a voltage equal to the step ΔV between two successive voltage stages. The ramp rate RR is defined as the ratio between the voltage step ΔV and the duration Δt of the voltage stages 21. The RVS method makes it possible to plot a current-voltage (I-V) characteristic of the memory cell, hence it is possible to extract its programming voltage $V_{prog}$.

As demonstrated in the above-mentioned articles, the RVS programming method reduces the dispersion of the programming times compared to the CVS method. Even so, the time required to program a group of memory cells remains long.

SUMMARY OF THE INVENTION

The invention aims to reduce the time required to program a plurality of memory cells belonging to a resistive random access memory and to reduce the electrical stress undergone by these memory cells during their programming, in order to improve respectively the programming speed and the reliability of the resistive random access memory.

According to a first aspect of the invention, this objective tends to be achieved by providing a method for programming a resistive random access memory comprising a matrix of memory cells. This method comprises a programming step consisting in applying a programming voltage ramp to the memory cells of a part at least of the matrix, the programming voltage ramp starting at a first non-zero voltage value, called start voltage, and ending at a second voltage value, called stop voltage, greater in absolute value than the first voltage value. The method is remarkable in that the stop voltage is determined such that each memory cell of said at least one part of the matrix has a first probability comprised between $1/(10N)$ and $1/N$ of having a programming voltage greater in absolute value than the stop voltage, N being the number of memory cells in said at least one part of the matrix.

In other words, by accepting that at the most one memory cell (statistically) is not programmed at the end of the programming ramp, the stop voltage may be set at a value close to the programming voltage of the slowest memory cell of the part of the matrix. Conversely, in the RVS programming method of the prior art, the stop voltage is chosen excessively high, in order to ensure that all the memory cells are actually programmed. The stop voltage of the programming ramp used in the method according to the invention is thus lower than that used in the method of the prior art, which has the effect of reducing the programming time and the electrical stress undergone by the memory cells.

In a preferential embodiment of the method according to the invention, the start voltage is determined such that each memory cell of said at least one part of the matrix has a second probability comprised between $1/(10N)$ and $1/N$ of having a programming voltage less in absolute value than the start voltage.

Whereas the start voltage of the programming ramp is set at a very low value in the RVS method of the prior art, typically at a voltage step $\Delta V$ of the ramp, the start voltage is here set at a value close to the programming voltage of the fastest memory cell, because it is allowed that one memory cell (statistically) is programmed at a voltage value (the start voltage) greater than the real programming voltage of the memory cell. A superfluous programming time and a useless stress of the memory cells may thereby be avoided. Indeed, in the RVS method of the prior art, the first part of the voltage ramp, from the first voltage stage up to the programming voltage of the fastest memory cell to program, practically does not contribute to the programming of the memory cells.

According to a development of this preferential embodiment, the method initially comprises a calibration step to determine the start voltage and the stop voltage of the programming voltage ramp, knowing the number N of memory cells in said at least one part of the matrix, said calibration step comprising the following operations:
- providing a plurality of reference memory cells identical to the memory cells of the matrix;
- measuring, for each reference memory cell, a voltage value at which said reference memory cell is programmed;
- establishing a distribution law from the programming voltage values of the reference memory cells; and
- determining, using the distribution law, the stop voltage corresponding to the first probability and the start voltage corresponding to the second probability.

The programming voltage value of each reference memory cell is preferably measured by applying to said reference memory cell a characterization voltage ramp, the characterization voltage ramp comprising successive voltage stages, and by measuring during successive voltage stages the current passing through said memory cell.

The method according to the invention may also have one or more of the characteristics below, considered individually or according to all technically possible combinations thereof:
- the stop voltage and/or the start voltage is determined from a distribution of programming voltages of a sample of memory cells, said distribution obeying a normal law;
- the first probability and the second probability are preferably equal, advantageously equal to $1/N$.

A second aspect of the invention relates to method for programming a resistive random access memory comprising a matrix of memory cells, said method comprising:
- a preliminary step of characterization of a plurality of reference memory cells, making it possible to measure a programming voltage value for each reference memory cell;
- a step of statistical adjustment of the programming voltage values, making it possible to establish a probability law followed by the memory cells of the matrix;
- a step of determining a programming voltage value at which a predetermined number of memory cells of the matrix is programmed, according to the probability law;
- a step of applying the programming voltage value to the memory cells of the matrix.

A third aspect of the invention relates to an electronic device comprising means for implementing the programming method according to the first aspect of the invention or the second aspect of the invention.

BRIEF DESCRIPTION OF THE FIGURES

Other characteristics and advantages of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION OF AT LEAST ONE EMBODIMENT

In the following description, "programming" designates the operation consisting in making a resistive random access memory (RRAM) cell switch reversibly between a high resistance state called "HRS" and a low resistance state called "LRS". When the resistive memory cell passes from the state HRS to the state LRS, the corresponding programming operation is called writing or "set". Conversely, when the resistive memory cell passes from the state LRS to the state HRS, the corresponding programming operation is called erasing or "reset". A programming operation may thus be either a writing operation, or an erasing operation.

The resistive memory cell has in the state HRS an electrical resistance value $R_{HRS}$ above a first resistance threshold and in the state LRS an electrical resistance value $R_{LRS}$ below a second resistance threshold. The second resistance threshold is lower than the first resistance threshold. The difference between the first and second resistance thresholds is commonly called "programming window" of the memory cell.

Figure 1A:
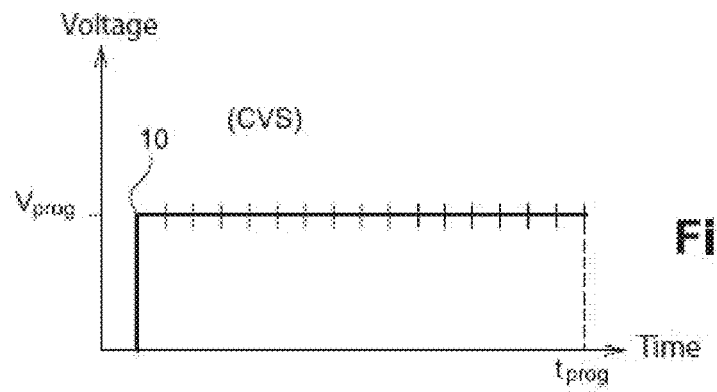
FIGS. 1A and 1B, described previously, represent two methods for programming a resistive memory cell according to the prior art.
Figure 1B:
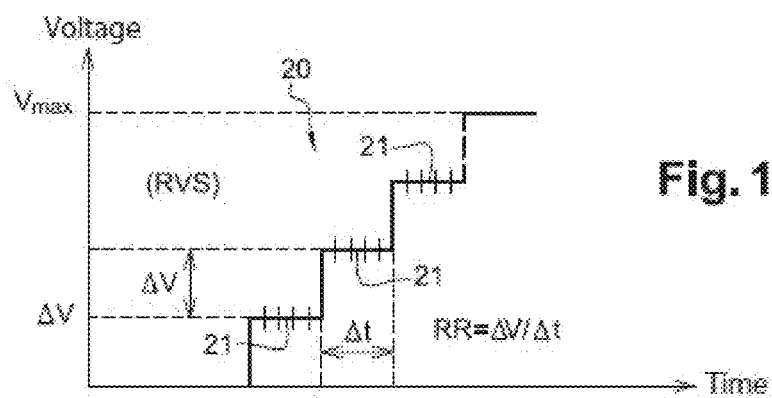
Figure 2:
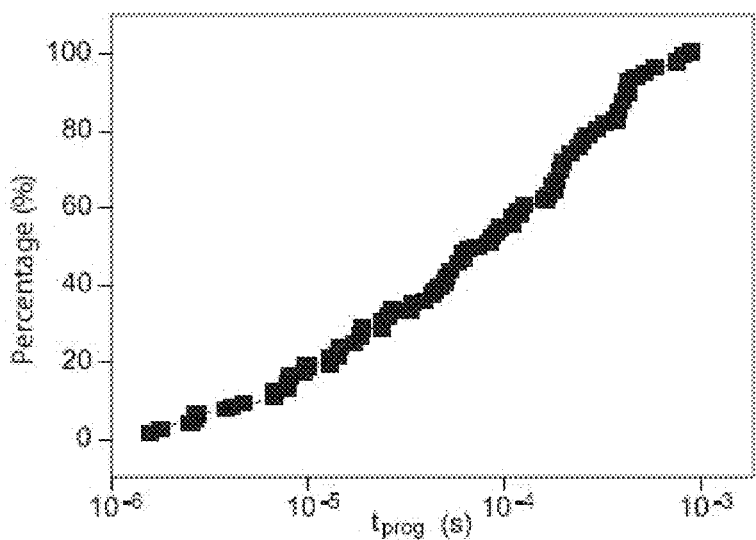
FIG. 2, described previously, represents the distribution of the programming times of a plurality of OxRAM memory cells programmed according to the method of FIG. 1A.
Figure 3:
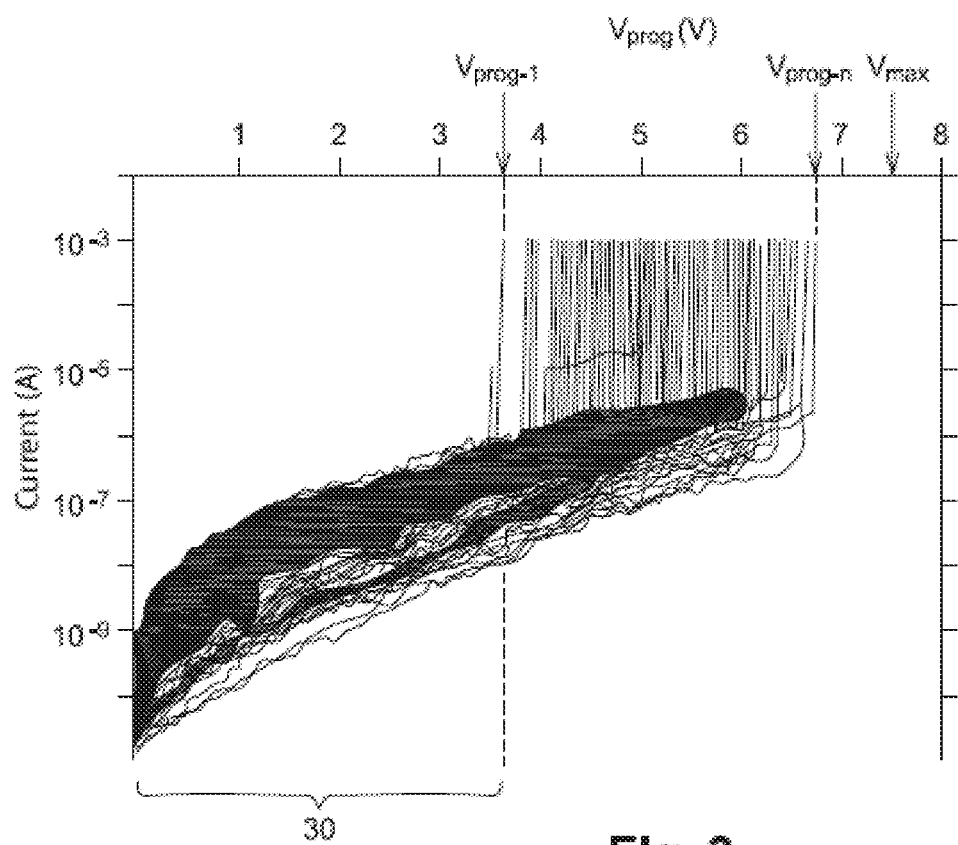
FIG. 3 represents the current-voltage characteristics of a plurality of OxRAM memory cells programmed according to the method of FIG. 1B.

FIG. 3 shows as an example the current-voltage (I-V) characteristics of a group of memory cells programmed in the state LRS by the RVS method of FIG. 1B. These memory cells are of OxRAM (Oxide-based Random Access Memory) type and comprise successively an upper electrode made of nickel, a dielectric layer made of hafnium oxide and a lower electrode made of doped silicon (i.e. stack of Ni/HfO$_2$/p$^+$-Si type). The voltage ramp that has been applied to these memory cells starts at a voltage of 0.1 V and increases by stages of 100 mV at a constant rate of 1.9 MV·s$^{-1}$ up to a maximum voltage $V_{max}$, for example 7.5 V.

As indicated previously, the passage from the state HRS to the state LRS (writing) of a resistive memory cell is reflected in its I-V characteristic by an abrupt increase in the electrical current. To avoid a too important increase in temperature and a destruction of the memory cells, a compliance current has been set at 1 mA.

In this example, the fastest memory cell of the group is programmed at a first voltage $V_{prog\_1}$ of around 3.5 V and the slowest memory cell of the group is programmed at a final voltage $V_{prog\_n}$ of around 6.8 V.

The portion 30 of the I-V characteristic that precedes the abrupt increase in the current does not contribute to the programming of the memory cell and thus represents a loss of time and energy. In other words, the part of the voltage ramp comprised between the first voltage stage at 0.1 V and the first programming voltage $V_{prog\_1}$ (here 3.5 V) represents useless electrical stress for the memory cells and the time that the voltage ramp takes to reach this first programming voltage $V_{prog1}$ is a superfluous programming time.

In an analogous manner, it may be observed in FIG. 3 that an important voltage difference separates the programming voltage ($V_{prog\_n}$=6.8 V) of the last memory cell (i.e. the slowest to program) and the maximum voltage of the programming ramp (7.5 V). This voltage difference also represents a loss of time and a useless electrical stress, because all the cells have already been programmed.

On the basis of these observations, the inventors have developed a novel method for programming a resistive random access memory. This programming method applies to any type of resistive random access memory of which the cells may be programmed collectively by applying thereto a voltage. The resistive random access memory is for example a PCRAM (Phase-Change Random Access Memory), a CBRAM (Conductive-Bridging Random Access Memory) or an OxRAM (Oxide-based Random Access Memory). Conventionally, the resistive random access memory comprises a plurality of memory cells arranged in lines and in columns, in the form of a matrix. Each memory cell comprises a first electrode, a second electrode and a layer of a dielectric material with variable electrical resistance arranged between the first and second electrodes. The electrodes and the dielectric material layer are generally stacked one upon another. The terms upper electrode and lower electrode are thus also used hereafter.

Figure 4:
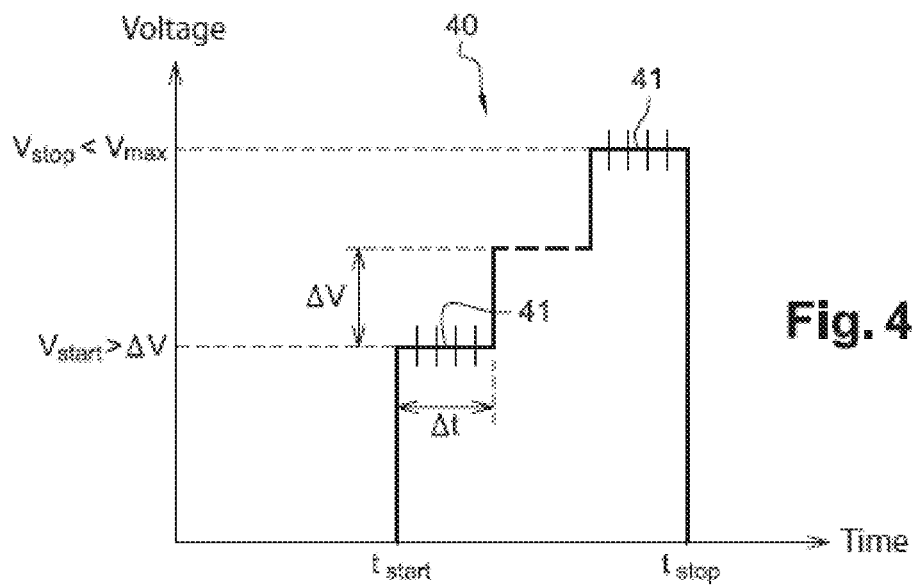
FIG. 4 shows a voltage ramp applied to resistive random access memory cells, during a programming method according to a preferential embodiment of the invention.

FIG. 4 schematically illustrates a preferential embodiment of the programming method according to the invention.

The programming method comprises a programming step consisting in applying to several memory cells of the matrix a same voltage ramp 40. The voltage ramp 40 may be applied to all of the memory cells of the matrix or to only a part of the matrix. In the following description, the example of a block of memory cells is taken. A block of memory cells designates a sub-matrix of memory cells, that is to say a group of memory cells arranged in lines and in columns, the number of lines of the block being less than the number of lines of the matrix and/or the number of columns of the block being less than the number of columns of the matrix. A block of memory cells contains for example 4096 memory cells distributed in 256 lines and 16 columns.

The programming step may be a step of writing or a step of erasing the block of memory cells, as a function of the sign of the voltage applied between the electrodes of the memory cells. Typically, a positive voltage ramp, increasing, is applied between the electrodes to write the memory cell (cf. FIG. 4) and a negative voltage ramp, decreasing, is applied between the electrodes to erase the memory cell.

The voltage ramp 40 is preferably in staircase form, that is to say that it comprises a succession of voltage stages 41. These voltage stages 41 make it possible to stress the memory cells and, if needs be, to measure the current that passes through the memory cells during programming. The ramp rate (equal to the voltage step $\Delta V$ between two successive stages 41 divided by the duration $\Delta V$ of the stages 41) is chosen notably as a function of the desired programming rate. The higher this ramp, the shorter the programming time $t_{prog}$ of each memory cell but, on the other hand, the higher the programming voltage $V_{prog}$. The ramp rate 40 is for example comprised between 15 kV·s$^{-1}$ and 140 kV·s$^{-1}$.

The voltage ramp 40 starts (at the instant $t_{start}$) at a first non-zero voltage value $V_{start}$, called start voltage, and ends (at the instant $t_{stop}$) at a second voltage value $V_{stop}$, called stop voltage. The stop voltage $V_{stop}$ is greater in absolute value than the start voltage $V_{start}$.

The stop voltage $V_{stop}$ of the ramp 40 is determined from a first probability that each memory cell of the block has a programming voltage greater than the stop voltage $V_{stop}$ of the ramp, in other words from a first probability that each memory cell is not programmed at the stop voltage $V_{stop}$. This first probability is a function of the size of the block of memory cells to program, that is to say the number N of memory cells in the block. The first probability is chosen between 1/(10N) and 1/N (limits included), preferably between 1/(2N) and 1/N (limits included). With such a probability, the number of cells risking not being programmed is statistically 1 at the most. The stop voltage $V_{stop}$ is thereby brought back to a value close to the programming voltage of the slowest memory cell of the block, rather than set at an excessively high value ($V_{max}$).

In a preferential embodiment of FIG. 4, the start voltage $V_{start}$ of the ramp 40 is a non-zero voltage value well above the voltage step ΔV used in the RVS method of the prior art, close to the programming voltage of the fastest memory cell of the block. It is determined from a second probability that each memory cell of the block has a programming voltage below the start voltage $V_{start}$ of the ramp. Like the first probability, this second probability is a function of the number N of memory cells in the block. The second probability is comprised between 1/(10N) and 1/N (limits included), preferably between 1/(2N) and 1/N (limits included). With such a probability, the number of cells risking being programmed at a voltage value ($V_{start}$) greater than their real programming voltage is statistically 1 at the most.

The stop voltage $V_{stop}$ of the ramp 40 is preferably determined during a preliminary step called calibration step from a distribution of programming voltages. This distribution of programming voltages may be established from a sample of memory cells. The start voltage $V_{start}$ may also be determined from a distribution of programming voltages if it is sought to optimize the start point of the ramp.

To begin, the calibration step comprises the selection of a number $N_{ref}$ of reference memory cells. The reference memory cells are memory cells identical to the memory cells of the block to program, that is to say of same size and comprising the same stack of active layers (upper electrode, resistive material and lower electrode). The reference memory cells may be chosen within the resistive random access memory to which the block to program belongs or another resistive random access memory. The reference memory cells may also be unitary devices and thus not be arranged in lines and in columns like the memory cells of the block to program.

In order to obtain a distribution representative of a matrix of memory cells and reliable statistics, the number $N_{ref}$ of reference memory cells is advantageously greater than or equal to 70, preferably greater than equal to 100.

The calibration step next comprises an operation consisting in measuring the programming voltage value $V_{prog}$ of each reference memory cell. Preferably, the RVS characterization technique described in relation with FIG. 1B is used to measure the programming voltage $V_{prog}$ of each reference memory cell. As indicated previously, this technique consists in applying to each reference memory cell a so-called characterization voltage ramp until a predetermined current level is obtained, for example equal to 1 mA. This characterization voltage ramp comprises sufficiently long successive voltage stages to enable several measurements of the electrical current. The voltage ramp rate is for example equal to 140 kV/s. Several programming voltage values $V_{prog}$ are obtained at the end of this measuring operation.

Figure 5:
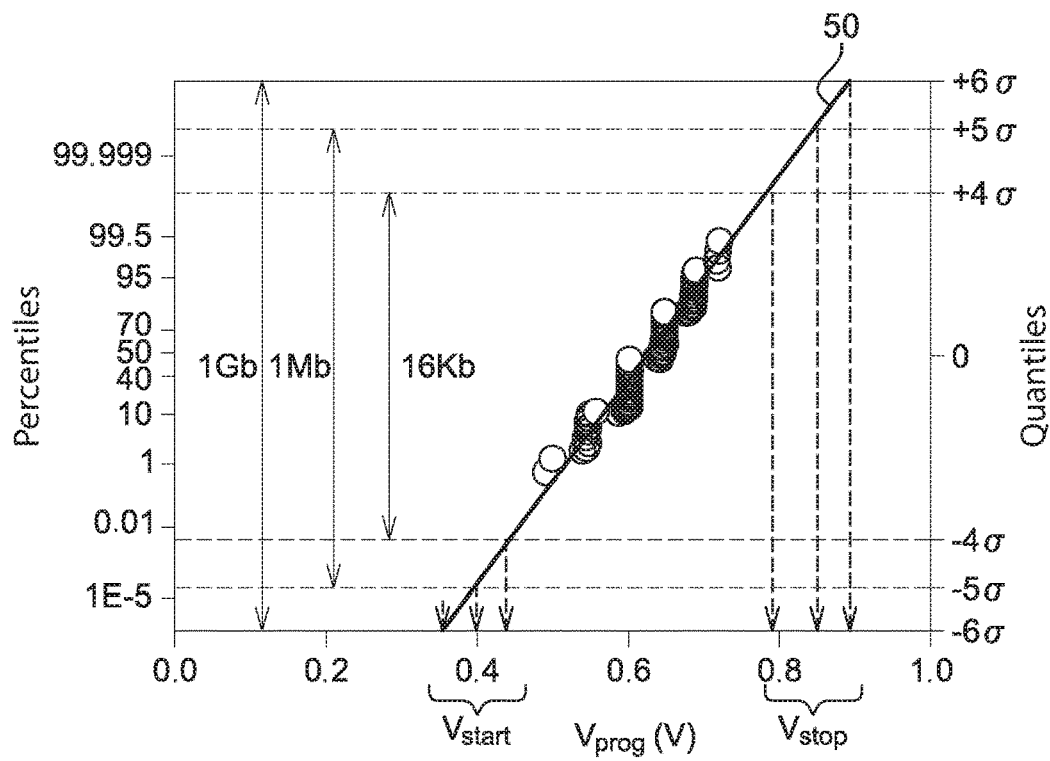
FIG. 5 represents an exemplary embodiment of a preliminary step of the programming method according to the invention, in order to determine the start voltage and the stop voltage of the ramp of FIG. 4.

The distribution of the programming voltage values $V_{prog}$ may next be represented on a graph, for example of the type of FIG. 5, by plotting on the X-axis the programming voltage $V_{prog}$ and the quantities on the Y-axis. The Y-axis scale of FIG. 5 is a gaussian-arithmetic scale, which can represent the cumulative number in percentages or "percentiles" (on the left in FIG. 5) or quantiles in number of a units (on the right in FIG. 5, σ being the standard deviation of the distribution law). The median value, obtained at 50% where 0 σ, corresponds to half of the reference memory cells. For example, 50% of the reference memory cells here have a programming voltage less than 0.6 V.

In the example of FIG. 5, the number of reference memory cells is equal to 100. The fastest memory cell is programmed at a voltage of 0.5 V and the slowest memory cell is programmed at a voltage of 0.75 V. All of the measured programming voltage values $V_{prog}$ are comprised between 0.5 V and 0.75 V. A voltage ramp 40 starting at 0.5 V and ending at 0.75 V would thus make it possible to program simultaneously these 100 reference memory cells.

By performing a statistical adjustment of the programming voltage values $V_{prog}$, it is observed that the programming voltage $V_{prog}$ obeys a normal distribution law. This normal distribution law is represented by a straight line 50 (known as a Henry line) in FIG. 5.

The straight line 50 gives the tendency that the memory cells of one type in particular follow. Once established, it makes it possible to determine the start voltage $V_{start}$ and the stop voltage $V_{stop}$ of the programming ramp 40 whatever the size of the block (or matrix) to program, that is to say whatever the number N of memory cells of this type in the block (or the matrix), without having need to characterize them all.

Indeed, each size of matrix (for example 16 Kb, 1 Mb, 1 Gb, etc.) corresponds to cumulative numbers of memory cells (in percentage) or quantiles (in number of a units, i.e. n*σ where n is a natural integer, positive or negative) which make it possible, using the normal distribution law 50, to determine the corresponding start voltage $V_{start}$ and stop voltage $V_{stop}$. These numbers or quantiles are calculated from the first and second probabilities defined above.

For example, in the case of a block of 16 Kb, i.e. 16384 memory cells, a first probability equal to 1/N is considered to determine the stop voltage $V_{stop}$ (i.e. it is allowed that one out of the N memory cells has a programming voltage greater than $V_{stop}$) and a second probability also of 1/N to determine the start voltage $V_{start}$ (i.e. it is allowed that one out of the N memory cells has a programming voltage less than $V_{start}$). The percentage of memory cells having a programming voltage greater than the stop voltage $V_{stop}$ (i.e. the allowed programming error rate) is thus equal to 0.0061% (1/16384*100) and the percentage of memory cells having a programming voltage less than the start voltage $V_{start}$ is also equal to 0.0061%. The percentage of memory cells having a programming voltage less than $V_{stop}$ (i.e. the targeted programming rate) is equal to 99.9939% (100%– 0.0061%). The percentage interval [0.0061%–99.9939%] corresponds to a deviation around the average value of ±4 σ. According to the distribution law 50, the start voltage $V_{start}$ corresponding to −4 σ (or 0.0061%) is equal to 0.45 V and the stop voltage $V_{stop}$ corresponding to +4 σ (or 99.9939%) is equal to 0.8 V. A voltage ramp 40 between 0.45 V and 0.8 V will thus make it possible to program (rapidly and while minimizing stresses) the block of 16384 memory cells (16 Kb) in one go.

Figure 6:
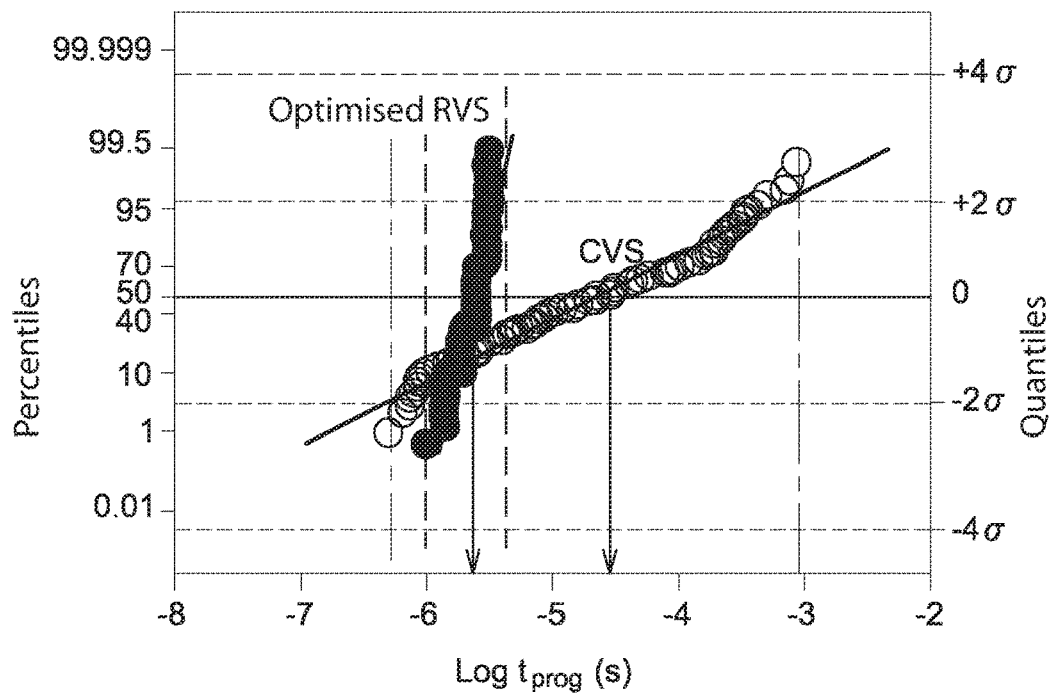
FIG. 6 represents the distribution of the programming times of a plurality of OxRAM memory cells programmed according to the method of the invention and according to the method of FIG. 1A.

FIG. 6 shows the distribution of the programming time $t_{prog}$ obtained with 150 OxRAM cells programmed in the state LRS using the method of the invention (designated "optimised RVS" in the figure) and, as a comparison, the distribution of the programming time $t_{prog}$ obtained with these same cells when they are programmed (in the state LRS) with the CVS method of the prior art. This graph, of the same type as that of FIG. 5, represents (on the Y-axis) the number of memory cells (expressed in percentage on the left scale and in number of a on the right scale), as a function of the logarithm of the programming time $t_{prog}$. The distribution of the programming time $t_{prog}$ globally has the form of a straight line, because the programming time $t_{prog}$ obeys a normal distribution law, like the programming voltage $V_{prog}$ (FIG. 5).

It may be noted thanks to this figure that the programming method according to the invention (optimised RVS method, such as described in relation with FIGS. 4 and 5) makes it possible to "tighten" considerably the distribution of the programming time $t_{prog}$. Indeed, for a statistic of ±2 σ (i.e. 95% of the memory cells), the distribution extends over approximately a half-decade in the case of the method according to the invention compared to more than 3 decades for the CVS method. Furthermore, the programming time $t_{prog}$ at the median (i.e. at 50% or 0 σ) is improved by around an order of magnitude, passing from around $10^{-4.5}$ s in the case of the CVS method to $10^{-5.6}$ s with the programming method according to the invention.

Figure 7:
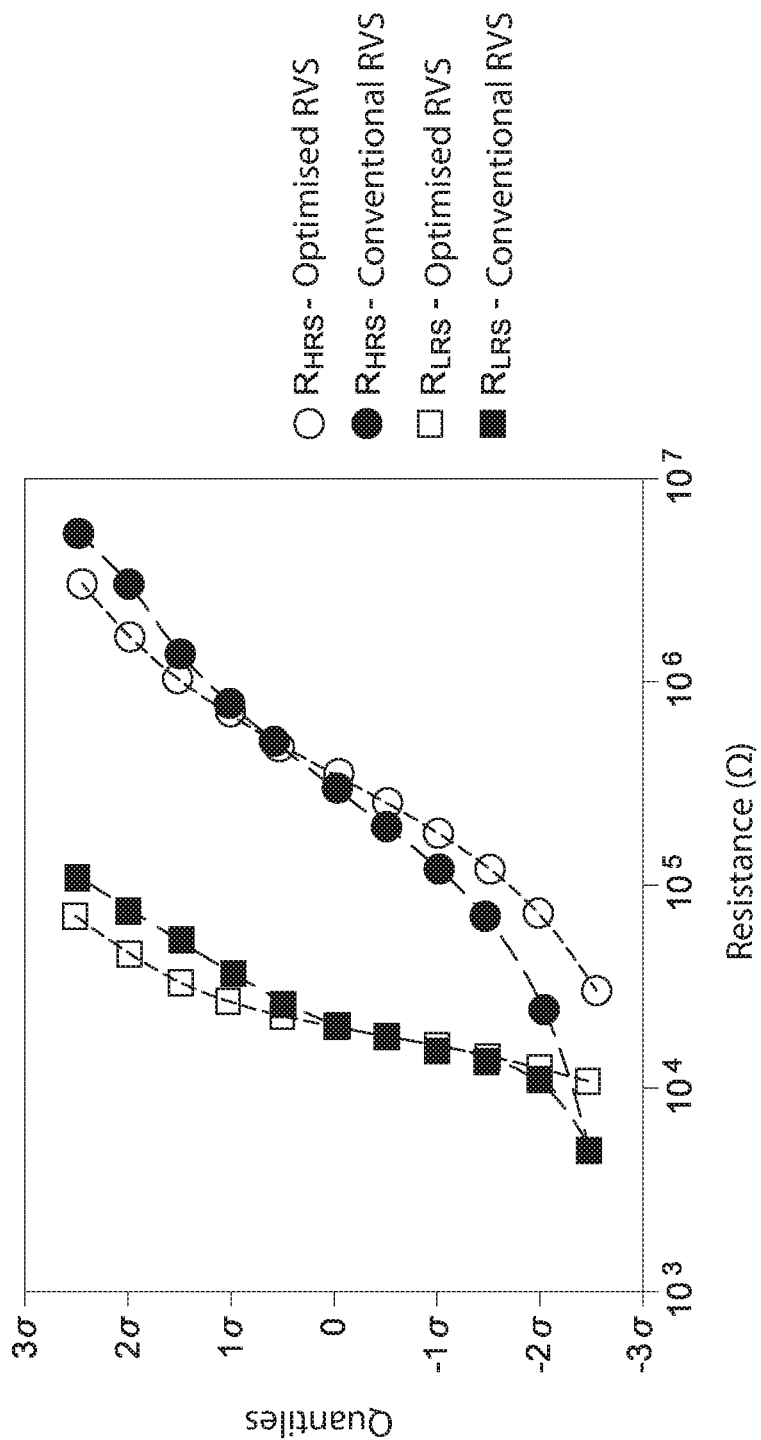
FIG. 7 represents the distribution of the resistances in the state LRS and in the state HRS of two OxRAM memory cells programmed according to the method of the invention and according to the method of FIG. 1B.

FIG. 7 is another graph showing the distribution of the resistance values in the state LRS ($R_{LRS}$) and in the state HRS ($R_{HRS}$) obtained during the cycling of two OxRAM memory cells. One cell has been programmed according to the RVS method of the prior art (designated "conventional RVS" in the figure) and another cell has been programmed according to the method of the invention ("optimised RVS"). The cycling is in this example constituted of one million writing-erasing cycles separated by reading operations to measure the resistance values. This graph, of the same type as those of FIGS. 5 and 6, represents (on the Y-axis) the difference compared to the average value of the resistance values (expressed in quantiles or number of a), as a function of the electrical resistance values (in logarithmic scale on the X-axis). Since the resistance also obeys a normal distribution law, the distributions of the resistances $R_{HRS}$ and $R_{LRS}$ each globally have the form of a straight line.

The optimization of the start voltage $V_{start}$ and the stop voltage $V_{stop}$ has the consequence of straightening the distributions of resistance $R_{LRS}$ and $R_{HRS}$ (the straight lines are more sloping). After 1 million programming cycles following the method of the invention, the resistance states LRS and HRS may still be distinguished, unlike the situation obtained with the conventional RVS method (where the distribution tails cross each other). The programming window may thus be respected during a greater number of cycles. These resistance distributions reflect an improvement in the reliability of the memory cell, because said cell undergoes less electrical stress during its programming thanks to the method according to the invention.

To implement the programming method according to the invention, the resistive random access memory could be equipped with a supply source configured to generate a voltage ramp between the start voltage $V_{start}$ and the stop voltage $V_{stop}$ and means for applying this voltage ramp to the memory cells of the matrix, such as one or more addressing circuits, word lines and bit lines.

The invention claimed is:

1. A method for programming a resistive random access memory comprising a matrix of memory cells, comprising a programming step that includes applying a programming voltage ramp to the memory cells of a part at least of the matrix, the programming voltage ramp starting at a start voltage having a first non-zero voltage value and ending at a stop voltage having a second voltage value greater in absolute value than the first voltage value,
   wherein the stop voltage is determined such that each memory cell of said at least one part of the matrix has a first probability comprised between 1/(10N) and 1/N of having a programming voltage greater in absolute value than the stop voltage, N being the number of memory cells in said at least one part of the matrix.

2. The method according to claim 1, wherein the stop voltage is determined from a distribution of programming voltages of a sample of memory cells, said distribution obeying a normal law.

3. The method according to claim 1, wherein the start voltage is determined such that each memory cell of said at least one part of the matrix has a second probability comprised between 1/(10N) and 1/N of having a programming voltage less in absolute value than the start voltage.

4. The method according to claim 3, wherein the start voltage is determined from a distribution of programming voltages of a sample of memory cells, said distribution obeying a normal law.

5. The method according to claim 3, wherein the first probability and the second probability are equal.

6. The method according to claim 5, wherein the first probability and the second probability are equal to 1/N.

7. The method according to claim 3, initially comprising a calibration step to determine the start voltage and the stop voltage of the programming voltage ramp, knowing the number N of memory cells in said at least one part of the matrix, said calibration step comprising the following operations:
   providing a plurality of reference memory cells identical to the memory cells of the matrix;
   measuring, for each reference memory cell, a voltage value at which said reference memory cell is programmed;
   establishing a distribution law from the programming voltage values of the reference memory cells; and
   determining, using the distribution law, the stop voltage corresponding to the first probability and the start voltage corresponding to the second probability.

8. The method according to claim 7, wherein the programming voltage value of each reference memory cell is measured by applying to said reference memory cell a characterization voltage ramp, the characterization voltage ramp comprising successive voltage stages, and by measuring during successive voltage stages a current passing through said memory cell.

9. The method according to claim 1, wherein the programming voltage ramp comprises successive voltage stages.

10. Electronic device comprising means for implementing the programming method according to claim 1.

11. A method for programming a resistive random access memory comprising a matrix of memory cells, said method comprising:
   a preliminary step of characterization of a plurality of reference memory cells, making it possible to measure a programming voltage value for each reference memory cell;
   a step of statistical adjustment of the programming voltage values, making it possible to establish a probability law followed by the memory cells of the matrix;

a step of determining a programming voltage value at which a predetermined number of memory cells of the matrix is programmed, according to the probability law;
a step of applying the programming voltage value at which a predetermined number of memory cells of the matrix is programmed to the memory cells of the matrix.

* * * * *